United States Patent
Shahzad et al.

(10) Patent No.: US 10,408,906 B2
(45) Date of Patent: *Sep. 10, 2019

(54) GPU BASED IMPLEMENTATION OF SENSE (A PARALLEL MRI ALGORITHM) USING QR DECOMPOSITION

(71) Applicant: COMSATS Institute of Information Technology, Islamabad (PK)

(72) Inventors: Hassan Shahzad, Islamabad (PK); Irfanullah, Islamabad (PK); Hammad Omer, Islamabad (PK)

(73) Assignee: COMSATS Institute of Information Technology, Islamabad (PK)

(*) Notice: Subject to any disclaimer, the term of this patent is extended or adjusted under 35 U.S.C. 154(b) by 255 days.

This patent is subject to a terminal disclaimer.

(21) Appl. No.: 15/627,605

(22) Filed: Jun. 20, 2017

(65) Prior Publication Data
US 2017/0371019 A1   Dec. 28, 2017

(30) Foreign Application Priority Data
Jun. 22, 2016  (PK) .................................. 380/2016

(51) Int. Cl.
*G01R 33/561*  (2006.01)
*G01R 33/48*   (2006.01)

(52) U.S. Cl.
CPC ........ *G01R 33/5611* (2013.01); *G01R 33/482* (2013.01)

(58) Field of Classification Search
None
See application file for complete search history.

(56) References Cited

U.S. PATENT DOCUMENTS

| | | | |
|---|---|---|---|
| 6,965,232 B2* | 11/2005 | Sodickson | G01R 33/3415 324/307 |
| 7,423,430 B1* | 9/2008 | Sharif | G01R 33/56325 324/309 |
| 2009/0285463 A1* | 11/2009 | Otazo | G06T 3/4053 382/131 |
| 2011/0006766 A1* | 1/2011 | Jurrissen | G01R 33/022 324/307 |
| 2011/0044524 A1* | 2/2011 | Wang | G01R 33/54 382/131 |
| 2014/0088899 A1* | 3/2014 | Liu | G01R 33/246 702/65 |
| 2015/0127291 A1* | 5/2015 | Ying | G01R 33/5611 702/104 |
| 2017/0371020 A1* | 12/2017 | Shahzad | G01R 33/5611 |

* cited by examiner

*Primary Examiner* — Jermele M Hollington
(74) *Attorney, Agent, or Firm* — H.C. Park & Associates, PLC

(57) ABSTRACT

A method of SENSE reconstruction including: constructing a coil sensitivity encoding matrix; inversing of the coil sensitivity encoding matrix using a QR decomposition algorithm; and multiplying an inverse of the receiver coil sensitivity encoding matrix with an under-sampled data using a central processing unit (CPU) and using a GPU residing on a host computer to further decrease computation time.

14 Claims, 8 Drawing Sheets

FIG. 1

$\vec{I} = \hat{C} \cdot \vec{\rho}$

GPU BASED IMPLEMENTATION OF SENSE (A PARALLEL MRI ALGORITHM) USING QR DECOMPOSITION

CROSS-REFERENCE TO RELATED APPLICATION

This application claims priority from and the benefit of Pakistani Provisional Patent Application No. 380/2016, filed on Jun. 22, 2016, which is hereby incorporated by reference for all purposes as if fully set forth herein.

BACKGROUND

Field

Exemplary embodiments relate to a Parallel Magnetic Resonance Imaging (pMRI) technique. More particularly, exemplary embodiments relate to SENSE, which is a pMRI technique that utilizes receiver coil sensitivities to reconstruct MR image from the acquired under-sampled k-space data.

Discussion of the Background

SENSE is a valuable complement to gradient encoding that reduces the MRI scan-time. SENSE may help to relax the requirements for breath-hold in cardiac imaging due to the reduction in scan time. It also opens the ways to realize for real time cardiac imaging without ECG triggering. Furthermore, it can be used to improve the spatial resolution of the resultant image. Due to the mentioned reasons SENSE is the most common parallel imaging method that is used clinically with slight modification in implementation.

SENSE requires sensitivity maps of the receiver coils and the under-sampled Cartesian data as input to reconstruct fully sampled MR image. Accurate sensitivity maps are the basic requirement for good reconstruction results in SENSE. However, long computation time has been a problem. Thus, a solution to reduce the computation time of SENSE is desired.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method including: constructing a coil sensitivity encoding matrix; inversing of the receiver coil sensitivity encoding matrix using a QR decomposition algorithm; and multiplying an inverse of the coil sensitivity encoding matrix with an under-sampled data using a central processing unit (CPU).

The method may be further implemented on a graphics processing unit (GPU) to exploit maximum parallelism using a parallel approach.

The method may further include computing all independent tasks by utilizing a maximum number of kernels.

The method may further include acquiring the under-sampled data by skipping k-space lines.

The method may further include reconstructing Magnetic Resonance (MR) images by performing the inversion of coil sensitivity information.

The method may further include reconstructing Magnetic Resonance (MR) images from the under-sampled data acquired from MRI scanner having multiple receiver coils.

An acceleration factor may be less than the number of multiple receiver coils.

MR signals may be used and may be acquired by Cartesian sampling.

A system includes: a computer (with the CPU) and a Magnetic Resonance Imaging (MRI) scanner, wherein the data acquired from the MRI scanner may be processed by the CPU by applying the method.

A system includes: a computer (with the CPU and the GPU) and a Magnetic Resonance Imaging (MRI) scanner, wherein the data acquired from the MRI scanner may be processed by the GPU residing on a host computer by applying the method.

According to another exemplary embodiment, a method includes: constructing a coil sensitivity encoding matrix; inversing of the coil sensitivity encoding matrix using a QR decomposition algorithm; and multiplying inverse of the receiver coil sensitivity encoding matrix with an under-sampled data using a GPU residing on a host computer.

The method may be further implemented on a graphics processing unit (GPU) to exploit maximum parallelism using a parallel approach.

The method may further include computing all the independent tasks by utilizing a maximum number of kernels.

The method may further include acquiring the under-sampled data by skipping k-space lines.

The method may further include reconstructing Magnetic Resonance (MR) images by performing the inversion of the receiver coil sensitivity encoding matrix.

The method may further include reconstructing Magnetic Resonance (MR) images from the under-sampled data acquired from MRI scanner having multiple receiver coils.

An acceleration factor may be less than the number of receiver coils.

MR signals may be used and may be acquired by Cartesian sampling.

A system includes: an MRI scanner and a computer comprising the GPU, wherein the data acquired from the MRI scanner may be processed by the GPU by applying the method Additional aspects will be set forth in the detailed description which follows, and, in part, will be apparent from the disclosure, or may be learned by practice of the inventive concept.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 1 is a pictorial representation of the main equation of SENSE.

DETAILED DESCRIPTION OF THE ILLUSTRATED EMBODIMENTS

Figure 1:
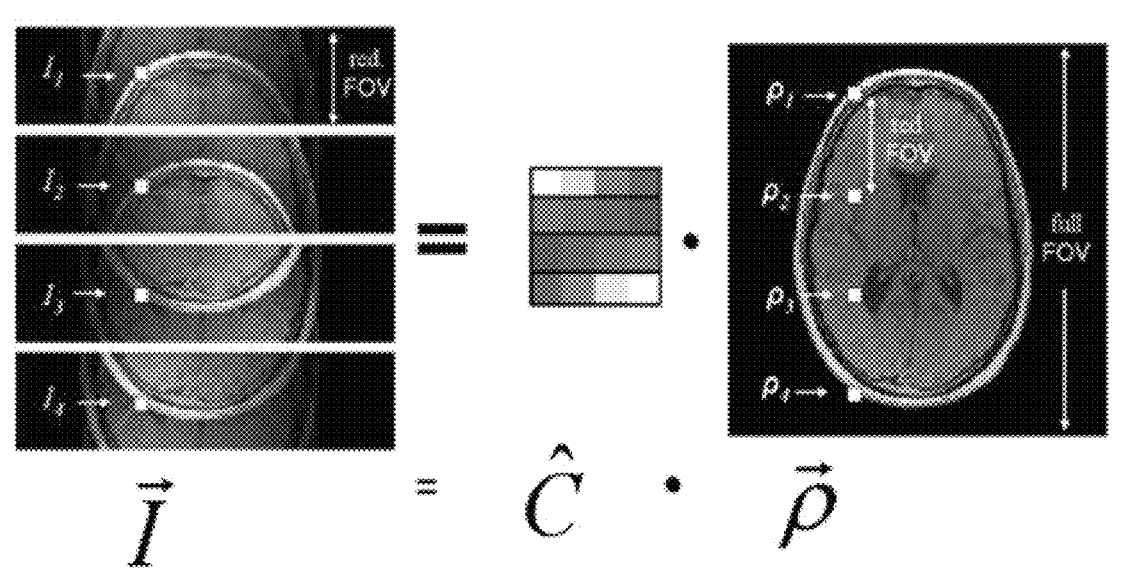

FIG. 1 is a pictorial representation of the main equation of SENSE:

$$\vec{I} = \hat{C} * \vec{\rho} \qquad (1)$$

Where $\vec{I}$ represents the folded pixels; $\hat{C}$ is the receiver coil sensitivities and $\vec{\rho}$ is the required image. The pictorial representation of this equation is shown in FIG. 1.

For equation 1, the equivalent mathematical matrix would be $$\begin{bmatrix} \vec{I}_1 \\ \vec{I}_2 \\ \vec{I}_3 \\ \vec{I}_4 \end{bmatrix} = \begin{bmatrix} C_{11} & C_{12} & C_{13} & C_{14} \\ C_{21} & C_{22} & C_{23} & C_{24} \\ C_{31} & C_{32} & C_{33} & C_{34} \\ C_{41} & C_{42} & C_{43} & C_{44} \end{bmatrix} \cdot \begin{bmatrix} \vec{\rho}_1 \\ \vec{\rho}_2 \\ \vec{\rho}_3 \\ \vec{\rho}_4 \end{bmatrix}$$

In order to find the solution image, $\hat{C}$ (encoding matrix) must be inverted as given below:

$$\vec{\rho} = \vec{I} \hat{C}^{-1} \qquad (2)$$

It is to be noted that normally $\hat{C}$ matrix is not a square matrix, so its inverse cannot be calculated directly. Methods such as Cholesky factorization, QR decomposition, Left inverse method etc. can be used for the inversion of a rectangular matrix. In this work, QR decomposition based SENSE reconstruction is successfully implemented on CPU and GPU. The results show that SENSE reconstruction using GPU helps to significantly reduce the computational time. Of note, Q is an orthogonal matrix and R is an upper triangular matrix in linear algebra.

According to exemplary embodiments, QR decomposition is used to compute the inverse of the coil sensitivity encoding matrix '$\hat{C}$' in SENSE. Several methods exist to compute the QR decomposition. Due to the nature of the problem in this work Classical Gram-Schmidt projection based QR decomposition is used to implement SENSE reconstruction from the under sampled k-space data. QR algorithm decomposes a matrix C into matrices Q and R where C is an m×n rectangular matrix, Q is m×n orthogonal matrix and R is n×n upper triangular matrix.

Figure 2:
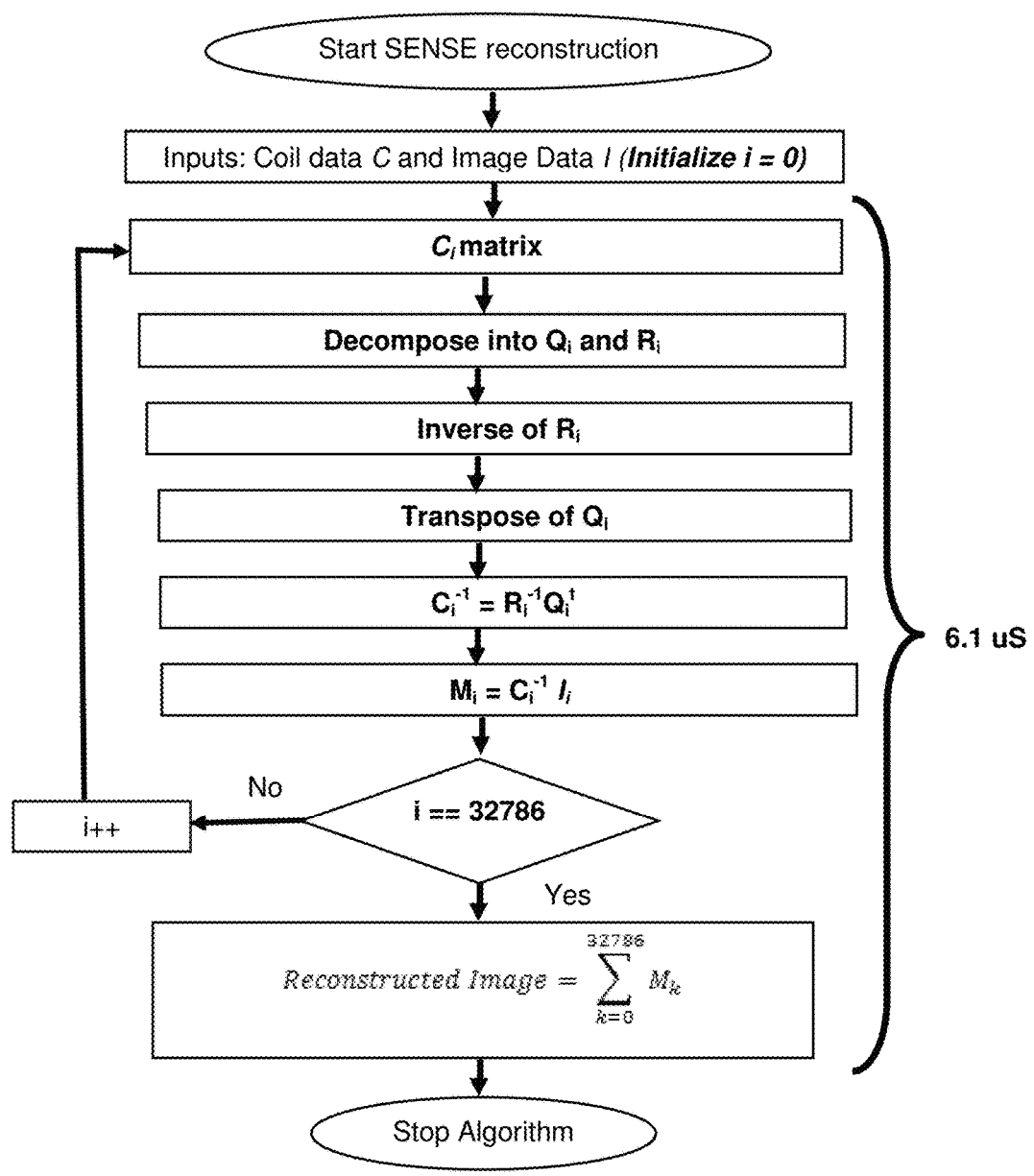
FIG. 2 is a flowchart showing QR decomposition based SENSE reconstruction, first implemented on Central Processing Unit (CPU) using C-language, based on an exemplary embodiment.

FIG. 2 is a flowchart showing QR decomposition based SENSE reconstruction implemented on a Central Processing Unit (CPU) using C-language, based on an exemplary embodiment. In the first step matrix is decomposed into matrices Q and R. In the next step, inverse of the square matrix R (2×2) called R' and Q$^t$ transpose of Q (8×2) is calculated. Afterwards, R' is multiplied with Q$^t$ to get the resultant value for the two points. As code for the CPU is written in C-language that will process data sequentially. So, C-language code requires multiple iterations for complete image reconstruction. The number of iterations required to reconstruct image depends on the size of the image and acceleration factor.

Figure 3:
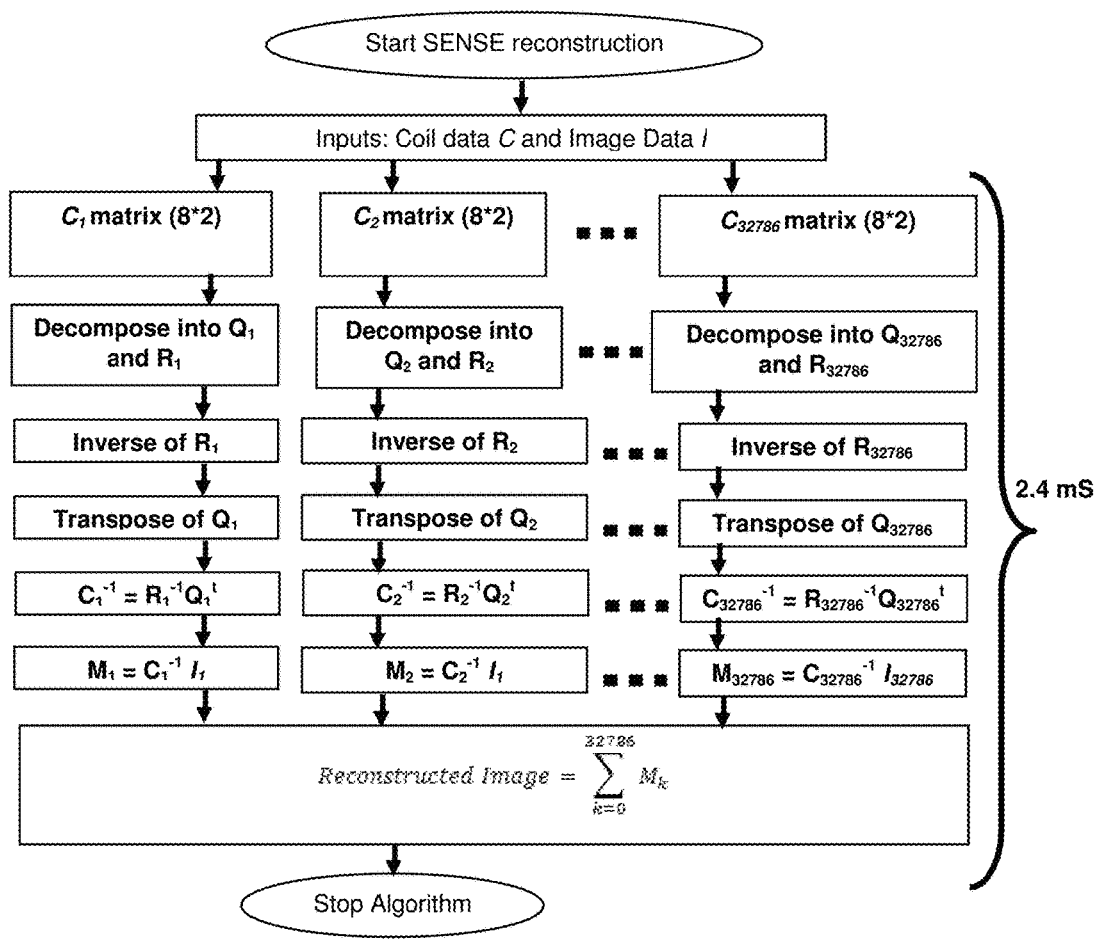
FIG. 3 shows a flow chart of an implementation of QR decomposition based SENSE reconstruction on GPU using Compute Unified Device Architecture (CUDA) language.

FIG. 3 shows a flow chart of an implementation of the QR decomposition based SENSE reconstruction on GPU using Compute Unified Device Architecture (CUDA) language. Further reduction in image reconstruction time is achieved by such implementation. CUDA supports multiple thread execution in parallel. The loop in C language is easily unrolled for parallel implementation because there are no dependencies between iterations. One single thread is assigned against each C code iteration that will perform all the required steps for QR decomposition based SENSE reconstruction. Threads equal to the number of iterations in C implementation are launched at once to get maximum possible speedup and performance. However, the total number of operations performed in CUDA code for GPU is the same as C code for CPU. Due to this reason quality of the reconstruction results obtained from GPU is the same as in CPU but with almost 6× less time.

Exemplary embodiments present the implementation of QR based SENSE algorithm on CPU and GPU to reconstruct MR images from the acquired under-sampled data. The experiments are performed on different datasets. Simulated human head dataset having 8 channel head coils is used to test the feasibility of QR based SENSE approach.

The performance of QR based SENSE algorithm is evaluated using artifact power and reconstruction time. Artifact power is a measure of the square difference error between the reference image ($I_{ref}$) and the reconstructed image ($I_{recon}$). It is measured by Equation 2:

$$AP = \frac{\Sigma ||I_{ref}| - |I_{recon}||^2}{\Sigma |I_{ref}|^2} \qquad \text{Equation 2}$$

Figure 4A:
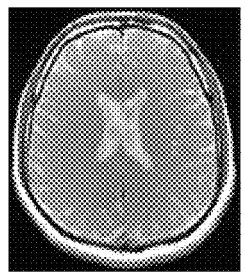
FIG. 4A shows an original human head dataset image using QR based SENSE algorithm according to an exemplary embodiment.
Figure 4B:
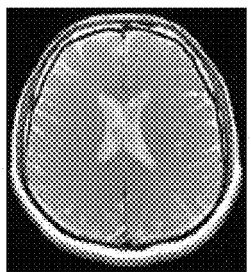
FIG. 4B shows the reconstructed image of human head dataset reconstructed using QR based SENSE algorithm on CPU according to an exemplary embodiment.
Figure 4:
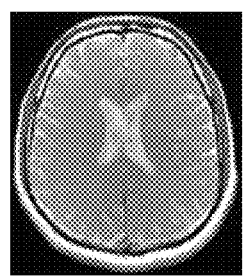
FIG. 4C shows the reconstructed image of human head dataset reconstructed using QR based SENSE algorithm on GPU according to an exemplary embodiment.

FIGS. 4A, 4B, and 4C are the human head dataset reconstructed images using QR based SENSE algorithm. FIG. 4A shows the original image, FIG. 4B shows the reconstructed image using CPU and FIG. 4C shows the reconstructed image using GPU. The time taken by CPU (Core 2 Duo 3.00 GHz) for human head data set is 200 ms because the inversion of Encoding matrix is performed iteratively. The implementation on GPU (Nvidia GTX 560 Ti) for human head data set takes 2.4 ms to reconstruct the same image as it performs the inversion of the encoding matrix in parallel. GPU implements the algorithm 83.33% faster than CPU.

Figure 5A:
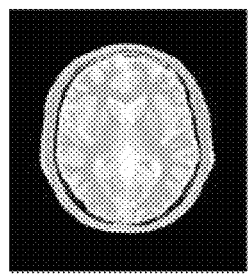
FIG. 5A shows an original image of simulated brain dataset using the method according to an exemplary embodiment.
Figure 5B:
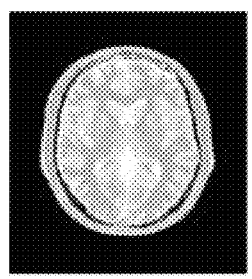
FIG. 5B shows the reconstructed image of simulated brain dataset using CPU according to an exemplary method.
Figure 5C:
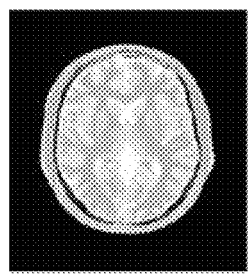
FIG. 5C shows the reconstructed image of simulated brain dataset using GPU according to an exemplary method.

FIGS. 5A, 5B, and 5C show the reconstructed images using CPU and GPU of simulated brain dataset using the proposed method. The time taken by CPU (Core 2 Duo 3.00 GHz) for simulated brain dataset is 191.3 ms while GPU (Nvidia GTX 560 Ti) for brain data set takes 19 ms to reconstruct the same image. GPU implementation of the proposed method is 10.06 times faster than CPU.

Figure 6A:
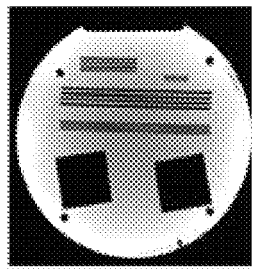
FIG. 6A shows the original image for comparison purpose of the phantom dataset images using QR based SENSE algorithm according to an exemplary embodiment.
Figure 6B:
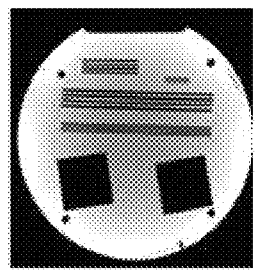
FIG. 6B shows the reconstructed phantom dataset image using QR based SENSE algorithm on CPU according to an exemplary embodiment.
Figure 6C:
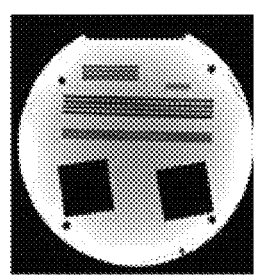
FIG. 6C shows the reconstructed phantom dataset image using QR based SENSE algorithm on GPU according to an exemplary embodiment.

FIGS. 6A, 6B and 6C show the phantom dataset reconstructed images using QR based SENSE algorithm. FIG. 6A shows the original image, FIG. 6B shows the reconstructed image using CPU and FIG. 6C shows the reconstructed image using GPU. The time taken by CPU (Core 2 Duo 3.00 GHz) for phantom dataset is 814 ms while GPU (Nvidia GTX 560 Ti) for brain data set takes 192 ms to reconstruct the same image. GPU implements the algorithm 4.23 times faster than CPU.

Figure 7A:
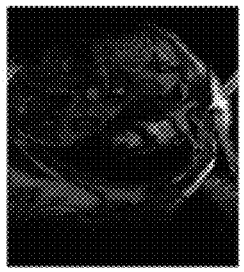
FIG. 7A shows the original image of cardiac dataset having 30 channel coils according to an exemplary embodiment.
Figure 7B:
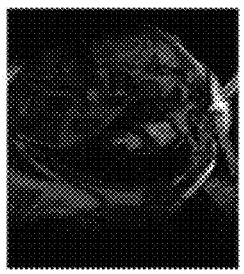
FIG. 7B shows the reconstructed image for undersampled 30 channel cardiac dataset using CPU according to an exemplary embodiment.
Figure 7C:
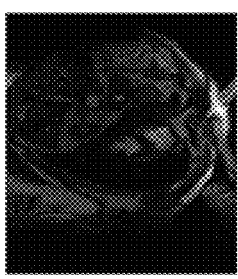
FIG. 7C shows the reconstructed image for undersampled 30 channel cardiac dataset using GPU according to an exemplary embodiment.

FIGS. 7A, 7B, and 7C show the reconstructed images of cardiac dataset acquired using 30 channel receiver coils and reconstructed using CPU and GPU. FIG. 7A shows the original image, FIG. 7B shows the reconstructed image using CPU and FIG. 7C shows the reconstructed image using GPU. The time taken by CPU (Core 2 Duo 3.00 GHz) for 30 channel cardiac dataset is 3395 ms while GPU (Nvidia GTX 560 Ti) takes 217.87 ms to reconstruct the same image. GPU implements the algorithm 15.5 times faster than CPU.

Table 1 shows the comparison of time taken by CPU and GPU for the reconstruction of simulated brain, phantom and cardiac datasets. A comparison of the artifact power (AP) is also given in table 1 which shows that the AP is same for both CPU and GPU implementations.

TABLE 1

Comparison of the time taken by CPU and GPU for Brain, Phantom and Cardiac datasets.

| Dataset used | No. of Coils | AF | Reconstruction Time (ms) CPU | Reconstruction Time (ms) GPU | Speedup | Artifact Power (AP) |
|---|---|---|---|---|---|---|
| Simulated Brain | 8 | 2 | 191.3 | 19 | 10.06x | 0.0041 |
| Phantom | 8 | 2 | 814 | 192 | 4.23x | 0.00091 |
| Cardiac | 30 | 2 | 3395 | 217.87 | 15.5x | 0.0057 |

Figure 8:
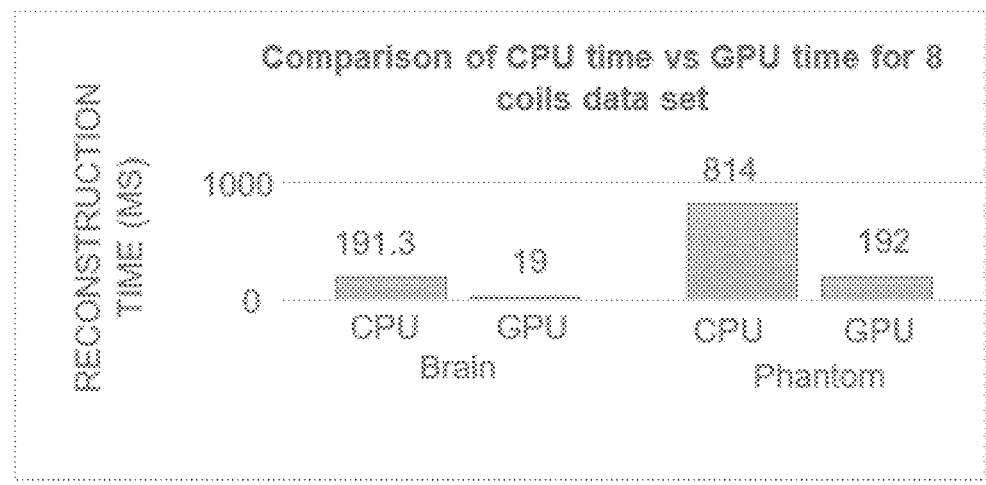
FIG. 8 shows a comparison of the time taken by CPU and GPU for the 8 receiver coil simulated human head and phantom datasets according to exemplary embodiments.

FIG. 8 shows the comparison of time taken by CPU and GPU for the 8 receiver coil simulated human head and phantom. The results show that GPU takes less time to compute inversion of the encoding matrix as compared to CPU without any degradation in the quality of the image.

Figure 9:
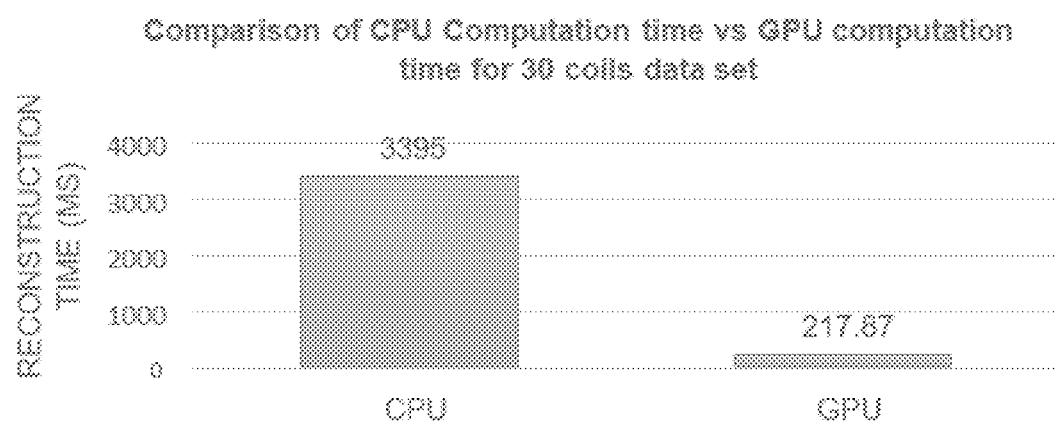
FIG. 9 gives a comparison of the time taken by CPU and GPU for the 30 receiver coil cardiac dataset according to an exemplary embodiment.

FIG. 9 gives a comparison of the time taken by CPU and GPU for 30 channel cardiac dataset. As shown by the bar graph, GPU takes less time to compute inversion of the encoding matrix as compared to CPU without any degradation in the quality of the image.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method, comprising:
constructing a coil sensitivity encoding matrix;
inversing of the coil sensitivity encoding matrix using a QR decomposition algorithm; and
multiplying an inverse of the coil sensitivity encoding matrix with an under-sampled data using a central processing unit (CPU);
computing all independent tasks by utilizing a maximum number of kernels;
wherein the step of multiplying is further implemented on a graphics processing unit (GPU) to exploit maximum parallelism using a parallel approach.

2. The method of claim 1, further comprising acquiring the under-sampled data by skipping k-space lines.

3. The method of claim 1, further comprising reconstructing Magnetic Resonance (MR) images by performing the inversion of receiver coil sensitivity encoding matrix.

4. The method of claim 1, further comprising reconstructing Magnetic Resonance (MR) images from the under-sampled data acquired from Magnetic Resonance Imaging (MRI) scanner having multiple receiver coils.

5. The method of claim 4, wherein an acceleration factor is less than the number of receiver coils.

6. The method in claim 1, wherein MR signals are used and acquired by Cartesian sampling.

7. A system, comprising:
a Magnetic Resonance Imaging (MRI) scanner and a computer comprising the CPU and the GPU,
wherein the GPU is configured to process the data acquired from the MRI scanner by
constructing a coil sensitivity encoding matrix;
inversing of the coil sensitivity encoding matrix using a QR decomposition algorithm;
computing all independent tasks by utilizing a maximum number of kernels; and
the CPU is configured to multiply an inverse of the coil sensitivity encoding matrix with an under-sampled data;
wherein the step of multiplying is further implemented on the GPU to exploit maximum parallelism using a parallel approach.

8. A method, comprising:
constructing a coil sensitivity encoding matrix;
inversing of the coil sensitivity encoding matrix using a QR decomposition algorithm; and
multiplying an inverse of the coil sensitivity encoding matrix with an under-sampled data using a GPU;
computing all the independent tasks by utilizing a maximum number of kernels.

9. The method of claim 8, further comprising reconstructing Magnetic Resonance (MR) images by performing the inversion of the coil sensitivity encoding matrix.

10. The method of claim 8, further comprising acquiring the under-sampled data by skipping k-space lines.

11. The method of claim 8, further comprising reconstructing Magnetic Resonance (MR) data from the under-sampled data acquired from a Magnetic Resonance Image (MRI) scanner having multiple receiver coils.

12. The method of claim 11, wherein an acceleration factor is less than the number of the multiple receiver coils.

13. The method in claim 8, wherein MR signals are used and are acquired by Cartesian sampling.

14. A system, comprising:
   an MRI scanner and a computer comprising the GPU,
   wherein the GPU is configured to process the data acquired from the MRI scanners by
   constructing a coil sensitivity encoding matrix;
   inversing of the coil sensitivity encoding matrix using a QR decomposition algorithm; and
   multiplying an inverse of the coil sensitivity encoding matrix with an under-sampled data;
   computing all the independent tasks by utilizing a maximum number of kernels.

* * * * *